United States Patent
Okudo et al.

(10) Patent No.: US 8,026,594 B2
(45) Date of Patent: Sep. 27, 2011

(54) SENSOR DEVICE AND PRODUCTION METHOD THEREFOR

(75) Inventors: Takafumi Okudo, Nara (JP); Yuji Suzuki, Hirakata (JP); Yoshiyuki Takegawa, Nara (JP); Toru Baba, Osaka (JP); Kouji Gotou, Neyagawa (JP); Hisakazu Miyajima, Osaka (JP); Kazushi Kataoka, Neyagawa (JP); Takashi Saijo, Kawanishi (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 285 days.

(21) Appl. No.: 12/094,772

(22) PCT Filed: Nov. 24, 2006

(86) PCT No.: PCT/JP2006/323455
§ 371 (c)(1),
(2), (4) Date: Jun. 12, 2008

(87) PCT Pub. No.: WO2007/061056
PCT Pub. Date: May 31, 2007

(65) Prior Publication Data
US 2009/0236678 A1  Sep. 24, 2009

(30) Foreign Application Priority Data

Nov. 25, 2005 (JP) ................. 2005-341223
Dec. 22, 2005 (JP) ................. 2005-371049
Dec. 22, 2005 (JP) ................. 2005-371053
Mar. 28, 2006 (JP) ................. 2006-089558

(51) Int. Cl.
*H01L 23/12* (2006.01)

(52) U.S. Cl. ............... 257/704; 257/E29.324; 438/125; 438/51

(58) Field of Classification Search .............. 257/48, 257/704, E29.324
See application file for complete search history.

(56) References Cited

U.S. PATENT DOCUMENTS 4,988,035 A   1/1991   Ueno et al.
(Continued)

FOREIGN PATENT DOCUMENTS

DE   103 51 761 A1   5/2004
(Continued)

OTHER PUBLICATIONS

Taiwanese Office Action for the Application No. 095143554 dated Sep. 17, 2009.
(Continued)

*Primary Examiner* — Ajay K Arora
(74) *Attorney, Agent, or Firm* — Cheng Law Group, PLLC

(57) ABSTRACT

A sensor device having small variations in sensor characteristics and improved resistance to electrical noise is provided. This sensor device has a sensor unit, which is provided with a frame having an opening, a movable portion held in the opening to be movable relative to the frame, and a detecting portion for outputting an electric signal according to a positional displacement of the movable portion, and a package substrate made of a semiconductor material, and bonded to a surface of the sensor unit. The package substrate has an electrical insulating film on a surface facing the sensor unit. The package substrate is bonded to the sensor unit by forming a direct bonding between an activated surface of the electrical insulating film and an activated surface of the sensor unit at room temperature.

10 Claims, 9 Drawing Sheets

U.S. PATENT DOCUMENTS

| | | | |
|---|---|---|---|
| 5,448,014 A | 9/1995 | Kong et al. | |
| 5,654,244 A | 8/1997 | Sakai et al. | |
| 6,222,868 B1 | 4/2001 | Ouchi et al. | |
| 6,228,675 B1 | 5/2001 | Ruby et al. | |
| 6,465,892 B1 | 10/2002 | Suga | |
| 6,555,901 B1 | 4/2003 | Yoshihara et al. | |
| 6,596,117 B2 * | 7/2003 | Hays et al. | 156/251 |
| 6,873,054 B2 | 3/2005 | Miyazawa et al. | |
| 6,892,578 B2 | 5/2005 | Saitoh et al. | |
| 7,176,599 B2 | 2/2007 | Kawachi et al. | |
| 2002/0008444 A1 | 1/2002 | Sakata et al. | |
| 2002/0180031 A1 | 12/2002 | Yamaguchi et al. | |
| 2003/0003684 A1 * | 1/2003 | Farrens et al. | 438/455 |
| 2003/0183921 A1 | 10/2003 | Komobuchi et al. | |
| 2004/0016981 A1 | 1/2004 | Yoshida et al. | |
| 2004/0053435 A1 | 3/2004 | Ikushima et al. | |
| 2004/0065638 A1 * | 4/2004 | Gogoi | 216/2 |
| 2004/0207485 A1 | 10/2004 | Kawachi et al. | |
| 2004/0238943 A1 | 12/2004 | Fujii | |
| 2005/0167795 A1 | 8/2005 | Higashi | |
| 2005/0217373 A1 | 10/2005 | Ishikawa et al. | |
| 2007/0011471 A1 | 1/2007 | Yu et al. | |
| 2007/0158822 A1 | 7/2007 | Fujii | |
| 2008/0302185 A1 | 12/2008 | Yakabe et al. | |
| 2009/0152656 A1 | 6/2009 | Okudo et al. | |
| 2009/0267165 A1 | 10/2009 | Okudo et al. | |

FOREIGN PATENT DOCUMENTS

| | | |
|---|---|---|
| EP | 0 278 030 A1 | 8/1988 |
| EP | 0 905 838 A1 | 3/1999 |
| JP | 60-053054 A | 3/1985 |
| JP | 02-012663 U | 1/1990 |
| JP | 02-063173 A | 3/1990 |
| JP | 02-079044 U | 6/1990 |
| JP | 2-218172 A | 8/1990 |
| JP | 05-095122 A | 4/1993 |
| JP | 5-175247 A | 7/1993 |
| JP | 05-175247 A | 7/1993 |
| JP | 5-281251 A | 10/1993 |
| JP | 5-288771 A | 11/1993 |
| JP | 07-283334 A | 10/1995 |
| JP | 08-015300 A | 1/1996 |
| JP | 8-18068 A | 1/1996 |
| JP | 08-032090 A | 2/1996 |
| JP | 09-266266 A | 10/1997 |
| JP | 10-177034 A | 6/1998 |
| JP | 2791429 B2 | 8/1998 |
| JP | 11-133052 A | 5/1999 |
| JP | 2001-060635 A | 3/2001 |
| JP | 2001-068616 A | 3/2001 |
| JP | 2003-100919 A | 4/2003 |
| JP | 2003-179085 A | 6/2003 |
| JP | 2003-318178 A | 11/2003 |
| JP | 2003-329704 A | 11/2003 |
| JP | 2004-028912 A | 1/2004 |
| JP | 2004-57507 A | 2/2004 |
| JP | 2004-057507 A | 2/2004 |
| JP | 2004-085547 A | 3/2004 |
| JP | 2004-109114 A | 4/2004 |
| JP | 3532788 B2 | 5/2004 |
| JP | 2004-200547 A | 7/2004 |
| JP | 2004-209585 A | 7/2004 |
| JP | 2004-233072 A | 8/2004 |
| JP | 2004-304622 A | 10/2004 |
| JP | 2004-364041 A | 12/2004 |
| JP | 2005-091166 A | 4/2005 |
| JP | 2005-127750 A | 5/2005 |
| JP | 2005-129888 A | 5/2005 |
| JP | 2005-166909 A | 6/2005 |
| JP | 2005-181644 A | 7/2005 |
| JP | 2005-191556 A | 7/2005 |
| JP | 2005-251898 A | 9/2005 |
| JP | 2005-292117 A | 10/2005 |
| JP | 2006-202974 A | 8/2006 |
| JP | 2006-322717 A | 11/2006 |
| KR | 1998-86900 A | 12/1998 |
| KR | 2003-17428 A | 3/2003 |
| TW | 093107297 | 2/2006 |
| WO | WO-2005/086597 A2 | 9/2005 |
| WO | WO-2005/104228 A1 | 11/2005 |
| WO | WO-2006/030716 A1 | 3/2006 |

OTHER PUBLICATIONS

International Search Report for the Application No. PCT/JP2006/323455 mailed Feb. 6, 2007.
Decision of Refusal for the Application No. 2006-089558 from Japan Patent Office mailed Sep. 25, 2007.
Decision of Refusal for the Application No. 2006-089589 from Japan Patent Office mailed Sep. 25, 2007.
Decision of Refusal for the Application No. 2006-089633 from Japan Patent Office mailed Sep. 25, 2007.
Notification of Reasons for Refusal for the Application No. 2005-371042 from Japan Patent Office mailed Dec. 26, 2006.
Notification of Reasons for Refusal for the Application No. 2006-089634 from Japan Patent Office mailed Dec. 26, 2006.
Notification of Reasons for Refusal for the Application No. 2006-089558 from Japan Patent Office mailed Mar. 6, 2007.
Notification of Reasons for Refusal for the Application No. 2006-089588 from Japan Patent Office mailed Mar. 6, 2007.
Notification of Reasons for Refusal for the Application No. 2006-089633 from Japan Patent Office mailed Mar. 6, 2007.
Takagi, Hideki et al., "Low Temperature, Pressure Less Bonding of Si and $SiO_2$ by the Surface Activation Method", Japan Welding Society Paper, 1997, vol. 61, pp. 224-225, (Abstract).
Itoh, Toshihiro et al., "Problems in MEMS Packaging and Application of Surface Activated Bonding (SAB) Method", Electronics Mounting Society Paper, 2001, vol. 4, No. 1, pp. 25-27, (Abstract).
Esashi, Masayoshi, "MEMS and Its Application", Journal of Japan Institute of Electronics Packaging, 2002, vol. 5, No. 6, pp. 537-541, (Abstract).
Suga, Tadatomo, "Bonding Technology for Micro-Machines", Plastic Processing Symposium, 2002, 211th, pp. 15-20, (Abstract).
Akaike, Hirotake et al., "Technology Tendency of Bonding for MEMS Device by Japanese Patent Research", Japan Institute of Electronics Packaging, 2003, vol. 6, No. 7, pp. 602-609, (Abstract).
Notice of Official Action for the Application No. 095143570 from Taiwan Intellectual Property Office dated Dec. 14, 2009.
Korean Office Action for the Application No. 10-2008-7012313 from Korean Intellectual Property Office dated Nov. 30, 2010.
International Search Report for Application No. PCT/JP2006/323459 mailed Feb. 6, 2007.
Notification of Reasons for Refusal for Application No. 2006-089555 from Japan Patent Office mailed Dec. 5, 2006
Notification of Reasons for Refusal for Application No. 2006-089586 from Japan Patent Office mailed Dec. 26, 2006.
Non-Final Office Action for the U.S. Appl. No. 12/094,674 from the United States Patent and Trademark Office mailed Oct. 1, 2010.
Non-Final Office Action for the U.S. Appl. No. 12/094,600 from the United States Patent and Trademark Office mailed Jan. 5, 2011.
Non-Final Office Action for the U.S. Appl. No. 12/094,600 from the United States Patent and Trademark Office mailed Mar. 1, 2011.
Supplementary European Search Report for the Application No. 06 83 3259 dated Jun. 24, 2011.

* cited by examiner

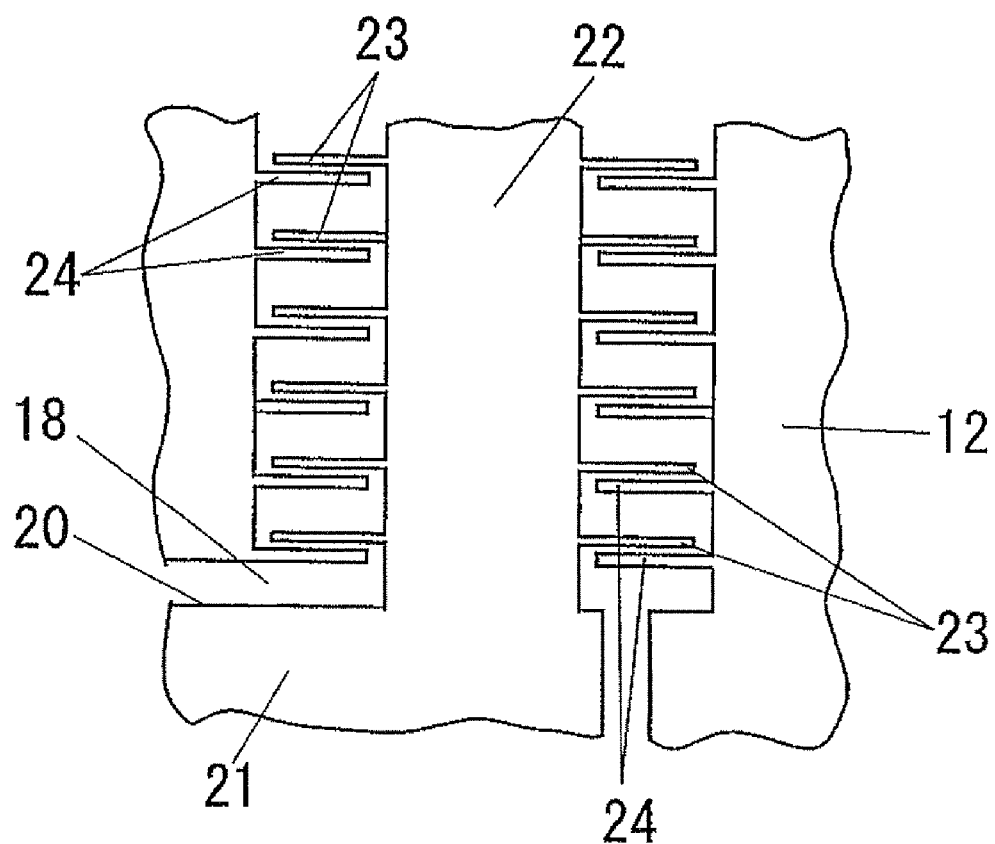
FIG.4
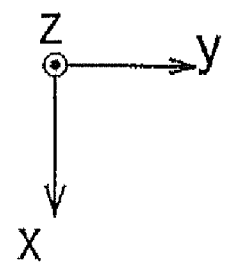

SENSOR DEVICE AND PRODUCTION METHOD THEREFOR

TECHNICAL FIELD

The present invention relates to a sensor device such as an acceleration sensor and a gyro sensor, and the production method therefor.

BACKGROUND ART

In recent years, a method for producing compact sensor devices such as an acceleration sensor and a gyro sensor by using a micromachining technique has attracted lots of attention.

For example, Japanese Patent Early Publication No. 2005-292117 discloses a gyro sensor comprising a sensor unit formed by use of a silicon substrate, and first and second package substrates each formed by use of a glass substrate. In the sensor unit, a part of a sensing portion is formed on a movable portion, which is disposed inside of a frame portion. The first package substrate has a through-hole wiring electrically connected to the sensing portion. The first package substrate is bonded to a surface of the sensor unit over the entire circumference of the frame portion. The second package substrate is bonded to the other surface of the sensor unit over the entire circumference of the frame portion.

In this gyro sensor, however, since the sensor unit is bonded to the package substrates by means of anodic bonding, there is a problem that variations in sensor characteristics increase due to the influence of thermal stress resulting from a difference in linear expansion coefficient between silicon and glass. In addition, even when the package substrate is formed by use of the same silicon substrate as the sensor unit, the variations in sensor characteristics may occur due to the residual stress at a bonding portion formed by a high temperature bonding process such as reflow soldering.

Additionally, in a sensor device such as the gyro sensor described above where a part of the sensor unit is utilized as an electrode such as a movable electrode and a stationary electrode, a silicon substrate having a relatively smaller resistivity than the silicon substrate suitable for the formation of integrated circuits is used as the silicon substrate for the sensor unit. Thereby, the impedance component of the electrode can be reduced to achieve high performance. However, since the package substrate and the sensor unit easily work as an exogenous noise transmission channel, the noise component may be overlapped with output signals of the sensing portion. In this case, a reduction in resistance to electrical noise comes into problem.

SUMMARY OF THE INVENTION

Therefore, in consideration of the above problems, a primary concern of the present invention is to provide a sensor device having small variations in sensor characteristics and improved resistance to electrical noise.

That is, the sensor device of the present invention comprises:
a sensor unit comprising a frame made of a semiconductor material and having an opening, a movable portion held in the opening to be movable relative to the frame, and a detecting portion configured to output an electric signal according to a positional displacement of the movable portion; and
a package substrate made of a semiconductor material, and bonded to a surface of the sensor unit;
wherein a region of the frame bonded to the package substrate has one of an activated surface of the frame and an activated surface of an electrical insulating film formed on the frame;
a region of the package substrate bonded to the frame has one of an activated surface of the package substrate and an activated surface of an electrical insulating film formed on the package substrate; and
the bonding between the sensor unit and the package substrate is a solid-phase direct bonding without diffusion between the activated surfaces in the presence of at least one of the electrical insulating films.

According to the present invention, since each of the sensor unit and the package substrate is formed by use of the semiconductor substrate, it is possible to reduce the influence of thermal stress resulting from a difference in linear expansion coefficient therebetween, and decrease variations in sensor characteristics. In addition, since the sensor unit is bonded to the package substrate through the electrical insulating film, a reduction in resistance to electrical noise can be prevented. Furthermore, since the sensor unit is bonded to the package substrate by the solid-phase direct bonding without diffusion, it is possible to avoid a problem that the variations in sensor characteristics occur due to residual stress at the bonding portion in the case of using a bonding method with a heat treatment such as reflow soldering.

To obtain the solid-phase direct bonding with good bonding strength, it is preferred that the activated surface is any one of a plasma-treated surface, an ion-beam irradiated surface, and an atomic-beam irradiated surface.

In addition, the bonding between the sensor unit and the package substrate is any one of the solid-phase direct bonding between the activated surface of the electrical insulating film of silicon oxide formed on the frame and the activated surface of the electrical insulating film of silicon oxide formed on the package substrate, the solid-phase direct bonding between the activated surface of silicon forming the frame and the activated surface of the electrical insulating film of silicon oxide formed on the package substrate, and the solid-phase direct bonding between the activated surface of the electrical insulating film of silicon oxide formed on the frame and the activated surface of silicon forming the package substrate.

In addition, to improve the airtightness and the bonding reliability, it is preferred that at least one of the electrically insulating film formed on the frame and the electrically insulating film formed on the package substrate is composed of a ring-like outer insulating film formed so as to surround the movable portion, and a ring-like inner insulating film formed so as to surround the movable portion at an inner side of the outer insulating film. In addition, to further improve the airtightness of the sensor unit provided by the formation of the outer and inner insulating films, it is particularly preferred that each of the electrically insulating film formed on the frame and the electrically insulating film formed on the package substrate is composed of the outer insulating film, the inner insulating film, and an auxiliary insulating film configured to connect between the outer insulating film and the inner insulating film, which is formed at plural locations spaced from each other by a predetermined distance in a circumferential direction of the inner insulating film, and each of a bonding between the outer insulating films, a bonding between the inner insulating films, and a bonding between the auxiliary insulating films is provided by the solid-phase direct bonding.

In the sensor device described above, it is preferred that an integrated circuit operable in collaboration with the detecting portion is mounted on the frame of the sensor unit. In this case, since a wiring distance between the sensing portion including the movable portion of the sensor unit and the integrated circuit becomes short, as compared with the case of using another semiconductor substrate for forming a circuit portion, it is hard to receive the influence of noises. In addition, it is effective to achieve reductions in mounting area and thickness of the sensor device.

The sensor unit according to a preferred embodiment of the present invention is a gyro sensor unit. In the gyro sensor unit, the movable portion comprises a first mass body vibrated by a vibrating means, and a second mass body coupled to the first mass body, and the detecting portion is configured to convert a positional displacement of the second mass body caused when a rotational force is applied during a vibration of the first mass body into an electrical signal.

In addition, it is preferred that the sensor unit is bonded at one of opposite surfaces to the package substrate, and at the other surface to a second package substrate, and the bonding between the sensor unit and the second package substrate is a solid-phase direct bonding without diffusion between a surface-activated region formed on the sensor unit and a surface-activated region formed on the second package substrate. Moreover, when the frame comprises a ring-like first metal layer formed so as to surround the movable portion, and a second metal layer formed at a side closer to the movable portion than the first metal layer, and electrically connected with the detecting portion, and the second package substrate comprises a through-hole wiring, a ring-like bonding metal layer formed at a position facing the first metal layer, and a wiring metal layer formed at a position facing the second metal layer, and electrically connected to the through-hole wiring, it is particularly preferred that the bonding between the sensor unit and the second package substrate is provided by a solid-phase direct bonding without diffusion between activated surfaces of the first metal layer and the bonding metal layer and a solid-phase direct bonding without diffusion between activated surfaces of the second metal layer and the wiring metal layer.

A further concern of the present invention is to provide a method of producing the sensor device described above. That is, this production method comprises the steps of:
providing a sensor unit comprising a frame made of a semiconductor material and having an opening, a movable portion held in the opening to be movable relative to the frame, and a detecting portion configured to output an electric signal according to a positional displacement of the movable portion;
providing a package substrate made of a semiconductor material;
performing a surface activation treatment under a reduced atmosphere to form one of an activated surface of the frame and an activated surface of an electrical insulating film formed on the frame, and one of an activated surface of the package substrate and an activated surface of an electrical insulating film formed on the package substrate; and
after the surface activation treatment, forming a direct bonding between the activated surfaces in the presence of at least one of the electrical insulating films at room temperature.

When it is needed to maintain the interior of the sensor device in a desired atmosphere, it is preferred that the surface activation treatment and the step of forming the direct bonding are performed in a same chamber, and an atmosphere adjusting step of adjusting the interior of the chamber to a desired atmosphere is performed before the step of forming the direct bonding and after the surface activation treatment. For example, when the sensor unit is an acceleration sensor, it is preferred that the atmosphere adjusting step comprises introducing an inert gas into the interior of the chamber. On the other hand, when the sensor device is a gyro sensor, it is preferred that the atmosphere adjusting step comprises adjusting a degree of vacuum in the chamber such that the step of forming the direct bonding is performed under a different reduced atmosphere (a higher vacuum atmosphere) from the surface activation treatment.

BRIEF EXPLANATION OF THE DRAWINGS

FIG. 4 is an enlarged view of a relevant portion of the sensor unit of the gyro sensor device;

BEST MODE FOR CARRYING OUT THE INVENTION

Figure 1:
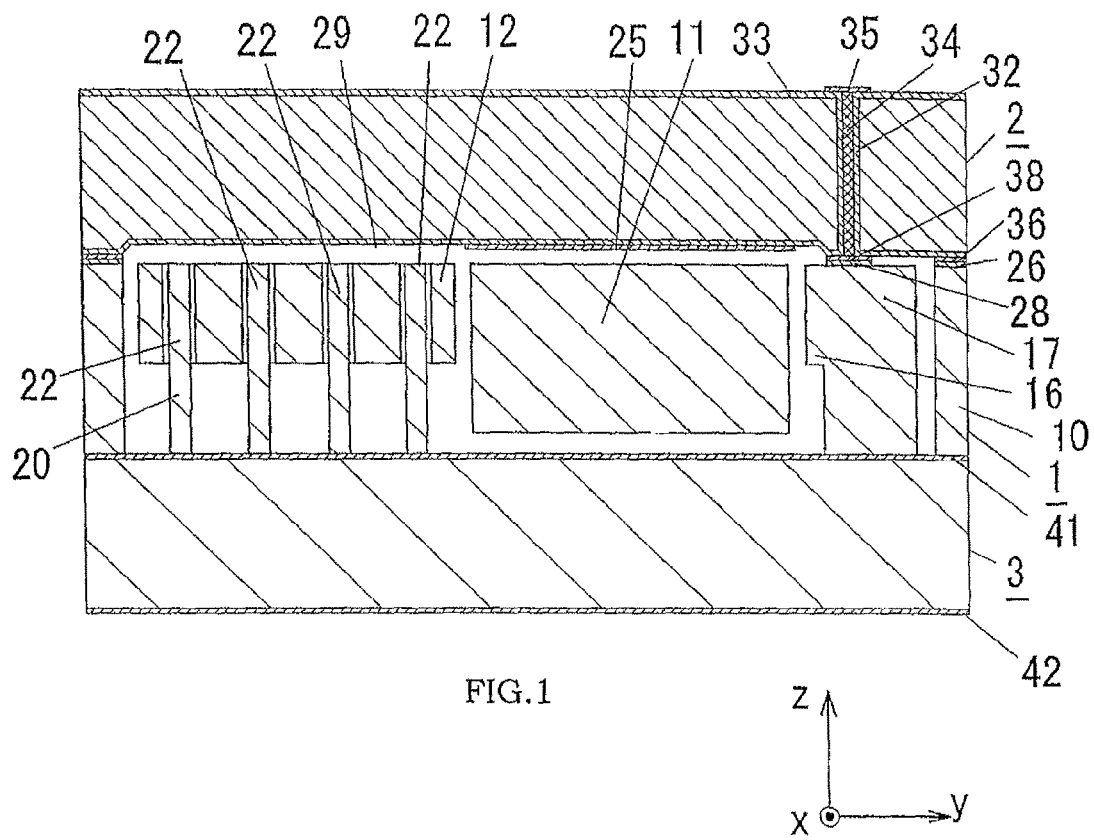
FIG. 1 is a schematic cross-sectional view of a gyro sensor device according to a first embodiment of the present invention.
Figure 2:
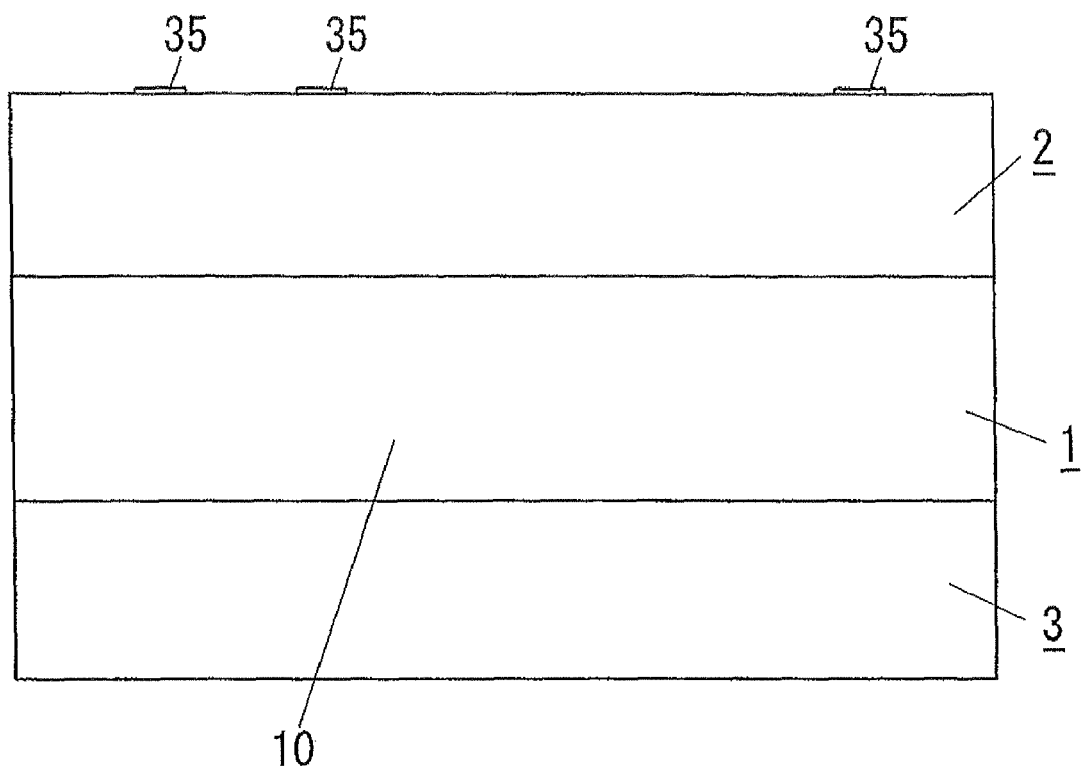
FIG. 2 is schematic side view of the gyro sensor device.
Figure 2:
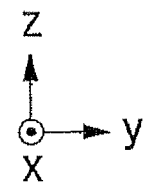
Figure 3:
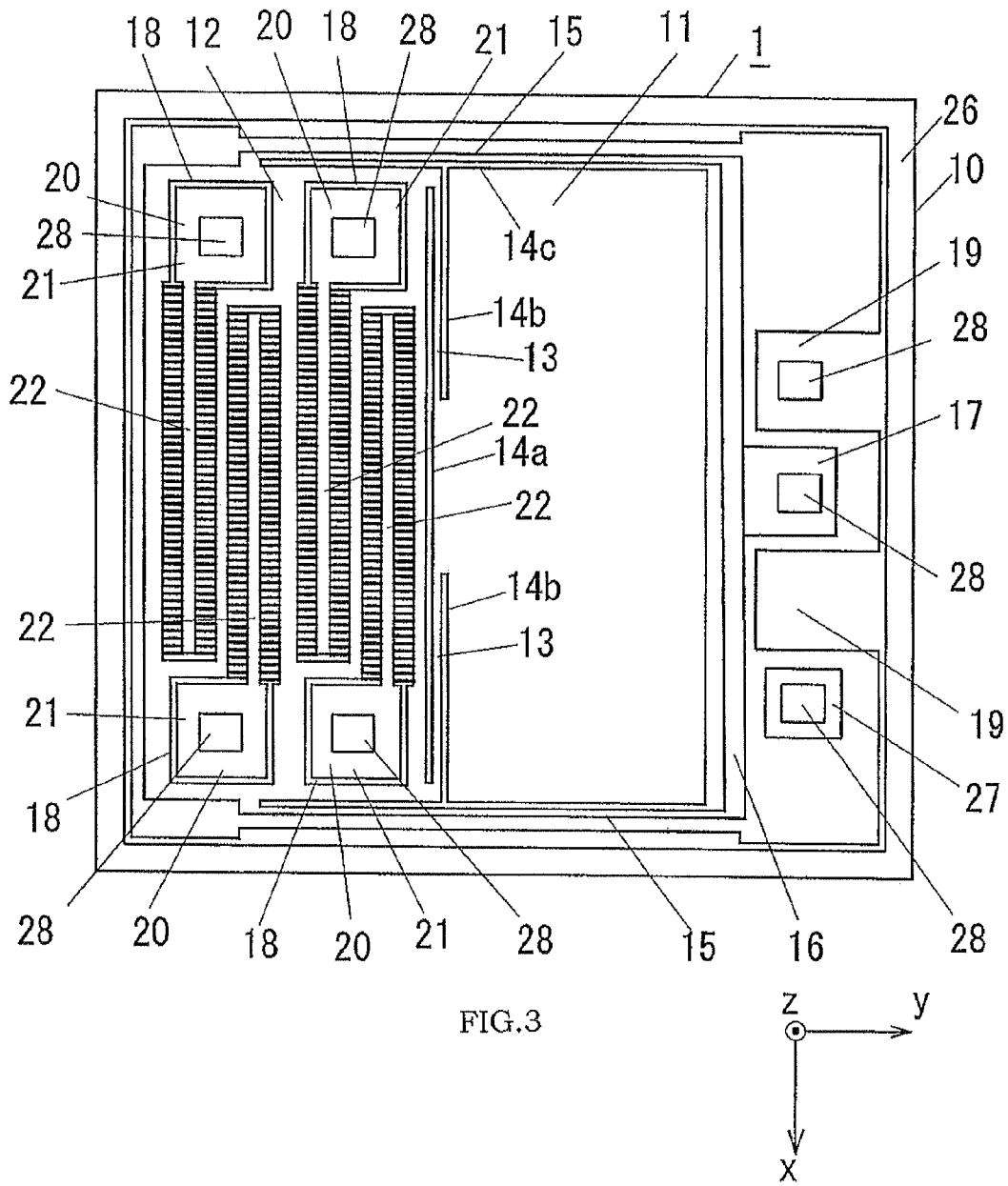
FIG. 3 is a schematic plan view of a sensor unit of the gyro sensor device.
Figure 5:
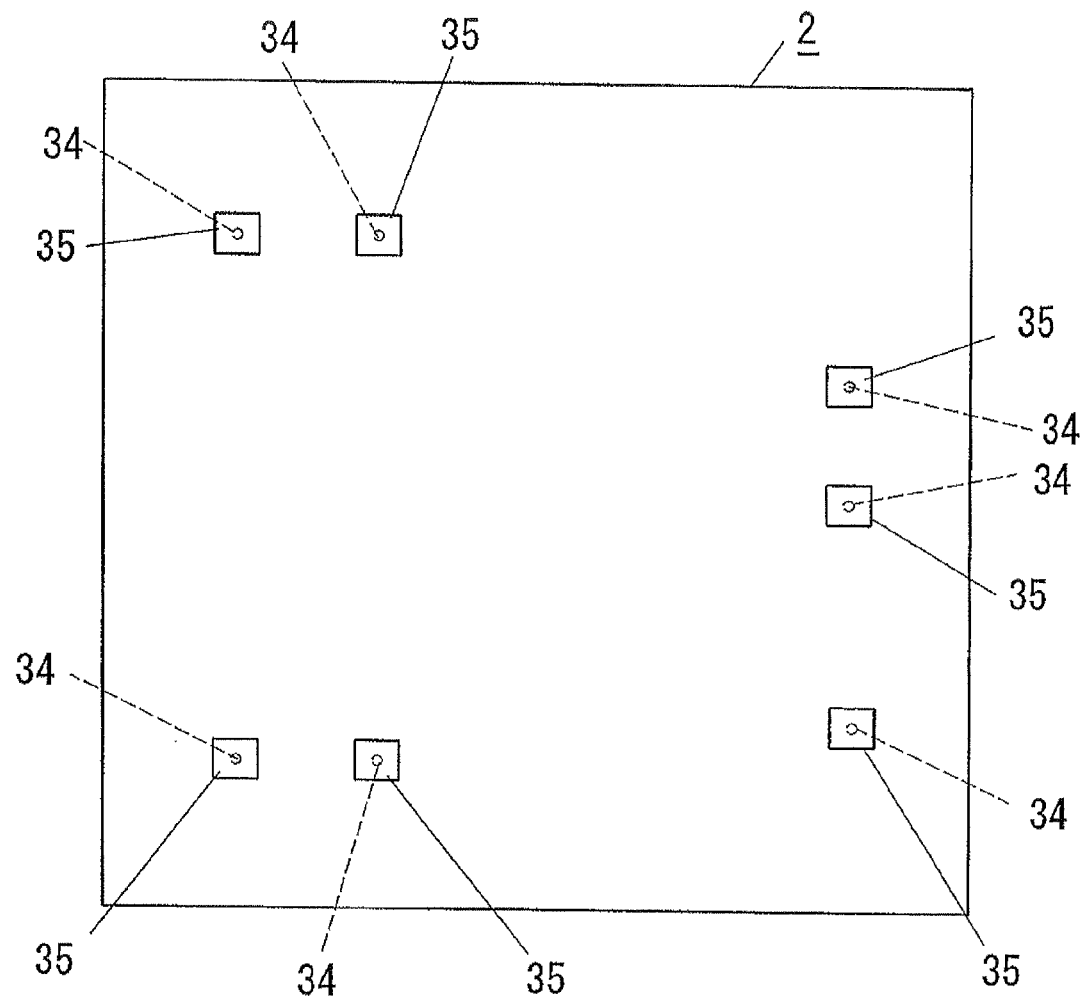
FIG. 5 is a schematic plan view of a second package substrate of the gyro sensor device.
Figure 6:
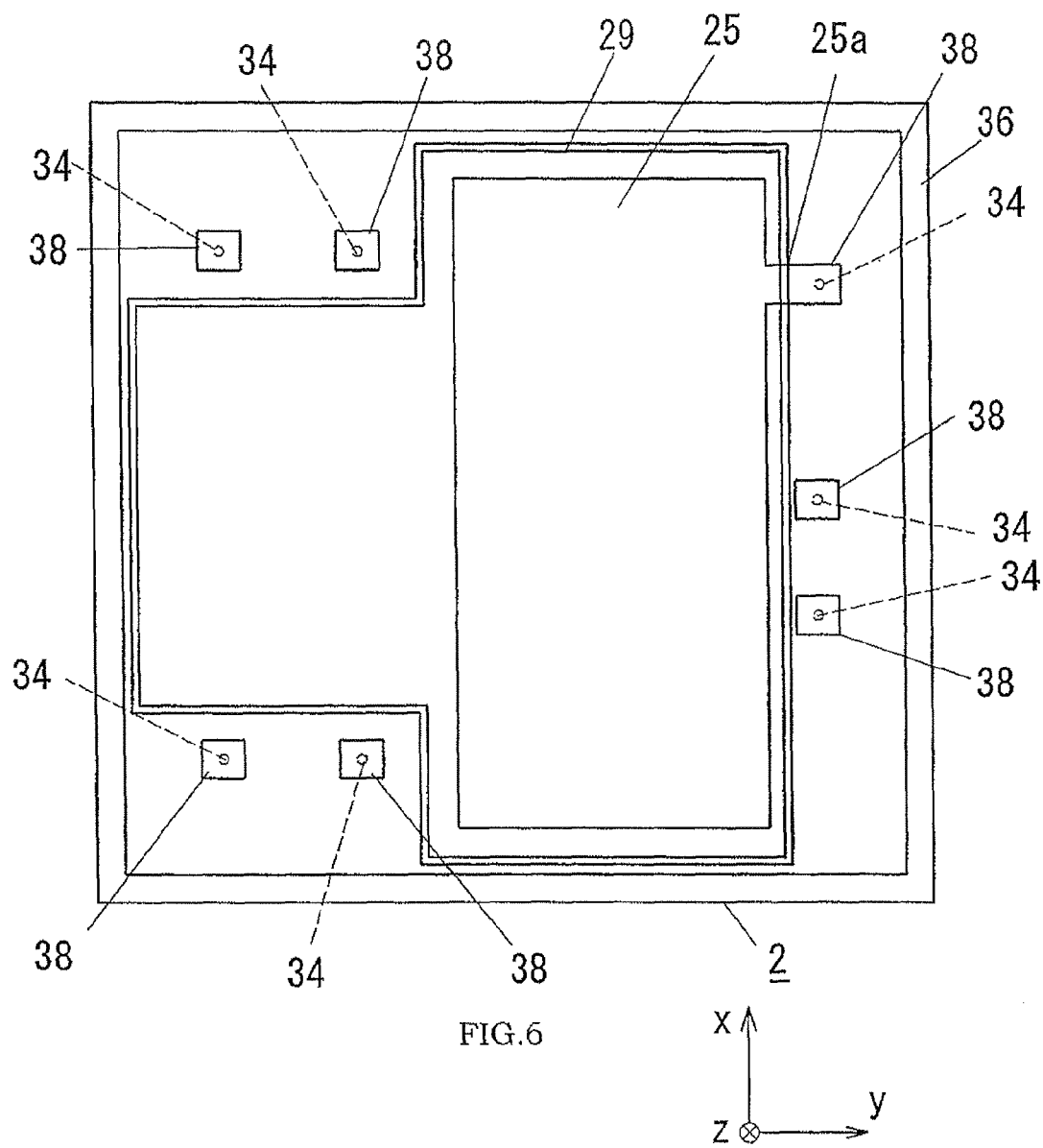
FIG. 6 is a schematic bottom view of the second package substrate of the gyro sensor device.

Referring to the attached drawings, the sensor device of the present invention and the production method therefor are explained below in detail according to preferred embodiments.

First Embodiment

A sensor device of the present embodiment is a gyro sensor device, which comprises a sensor unit 1 formed by use of a semiconductor material, a first package substrate 3 formed by use of a semiconductor material and sealingly bonded to a bottom surface of the sensor unit 1, and a second package substrate 2 formed by use of a semiconductor material and sealingly bonded to a top surface of the sensor unit 1. Each of the sensor unit 1, the first package substrate 3 and the second package substrate 2 has a rectangular outer peripheral shape. In addition, each of the package substrates (2, 3) has a same outside dimension as the sensor unit 1. In the present embodiment, a silicon substrate having a resistivity of 0.2 $\Omega \cdot cm$ is used as the semiconductor material for the sensor unit 1, and a silicon substrate having a resistivity of 20 $\Omega \cdot cm$ is used as the semiconductor material for the package substrates (2, 3). These resistivity values are illustrative only, and therefore the present invention is not limited to them.

In the sensor unit 1, a first mass body 11 and a second mass body 12, each of which has a rectangular outer peripheral shape in plan view, are arranged in parallel in parallel in a lateral direction along a top surface of the sensor unit 1. In addition, the sensor unit 1 has a frame portion 10 (e.g., a rectangular frame portion in the present embodiment) extending around the first and second mass bodies (11, 12). In the present embodiment, an orthogonal coordinate system is defined, as shown at a lower right portion in each of FIGS. 1 to 6. That is, a direction of arranging the first and second mass bodies (11, 12) corresponds to the "y" axis direction, and a horizontal direction orthogonal to the "y" axis direction corresponds to the "x" axis direction. In addition, a direction orthogonal to the "x" axis direction and the "y" axis direction (i.e., a thickness direction of the sensor unit 1) corresponds to the "z" axis direction.

The first mass body 11 and the second mass body 12 of the sensor unit 1 are integrally coupled to each other through a pair of drive springs 13 extending in the "x" axis direction. That is, the sensor unit 1 has a slit groove 14a having a length slightly shorter than the entire length of the second mass body 12 in the "x" axis direction, and two slit grooves 14b arranged in a straight line along the "x" axis direction and at the lateral side of the first mass body 11. Each of the slit grooves 14b has an opening at its one end. Each of the drive springs 13 is formed between the slit groove 14a and each of the slit grooves 14b. An end portion of each of the drive springs 13 continuously extends between an end portion of the slit groove 14a and a lateral edge of the second mass body 12, and the other end portion of each of the drive springs 13 continuously extends to the first mass body 11 through a region between the slit grooves 14b. The drive spring 13 is a torsion spring having a torsional deformation capability, and enables a positional displacement of the first mass body 11 relative to the second mass body 12 about the drive spring 13. That is, the drive springs 13 enable a translational movement in the "z" axis direction of the first mass body 11 relative to the second mass body 12 as well as a rotational movement about the "x" axis of the first mass body 11 relative to the second mass body 12. In addition, since the sensor unit 1 uses the torsion springs as the drive springs 13, it is not necessary to reduce a dimension of the drive spring 13 in the thickness direction of the sensor unit 1. Therefore, the drive springs 13 can be easily manufactured.

The numeral 15 designates a detection spring 15 extending in the "y" axis direction, and continuously connected at its one end to an end portion of in the "x" axis direction of the second mass body 12 of the sensor unit 1. The opposite end portion of one of the detection springs 15 is continuously connected to that of the other detection spring 15 through a coupling member 16 extending in the "x" axis direction. That is, a substantially "C" shaped member is formed in plan view by the pair of the detection springs 15 and the coupling member 16. In this regard, the coupling member 16 is designed to have a sufficiently higher rigidity than the drive springs 13 and the detection springs 15. The numeral 17 designates a fixation portion projecting from an intermediate portion in the longitudinal direction of the coupling member 16. The fixation portion 17 is fixed to a predetermined position of the first package substrate 3. The first and second mass bodies (11, 12) are separated from the detection springs 15 and the coupling member 16 by a slit groove 14c having a substantially "C" shape. The one end of the slit groove 14b is communicated with the slit groove 14c. Each of the detection springs 15 has a bending deformability in the "x" axis direction. Therefore, the detection springs 15 enable a positional displacement of the first and second mass bodies (11, 12) relative to the fixation portion 17 in the "x" axis direction.

By the way, the sensor unit 1 has four apertures 18 penetrating the second mass body 12 in the thickness direction, and a stationary part 20 disposed in each of the apertures 18. The stationary part 20 has an electrode portion 21 disposed in the vicinity of each end in the "x" axis direction of the second mass body 12, and comb bone portion 22 extending from the electrode portion 21 in the "x" axis direction. The electrode portion 21 and the comb bone portion 22 are configured in a substantially "L" shape. The electrode portion 21 and the comb bone portion 22 are bonded to the first package substrate 3. That is, the stationary part 20 is fixed at a predetermined position. An inner surface of the aperture 18 extends along an outer peripheral surface of the stationary part 20 through a clearance. A pair of electrode portions 21 is disposed at both ends in the "x" axis direction of second mass body 12. As shown in FIG. 4, a plurality of stationary comb teeth 23 arranged along the "x" axis direction are formed at both sides in the width direction of the comb bone portion 22. On the other hand, a plurality of movable comb teeth 24 are formed in the aperture 18 at a side facing the comb bone portion 22 of the second mass body 12, and arranged along the "x" axis direction such that each of the movable comb teeth 24 is in a face-to-face relation with each of the stationary comb teeth 23, as shown in FIG. 4. Each of the movable comb teeth 24 is located away from a corresponding stationary comb tooth 23 by a distance. When the second mass body 12 is displaced in the "x" axis direction, a change in distance between the stationary comb teeth 23 and the movable comb teeth 24 occurs, so that a change in electric capacitance caused by the change in distance is detected. That is, a detection means for detecting the positional displacement of the second mass body 12 is composed of the stationary comb teeth 23 and the movable comb teeth 24.

The sensor unit 1 is coupled to the first package substrate 3 by bonding the frame portion 10, the fixation portion 17, and the stationary part 20 to the first package substrate 3. In other words, the first package substrate 3 is used as a support substrate for supporting the sensor unit 1. On the other hand, since the first and second mass bodies (11, 12) are formed to be displaceable in the "z" axis direction, the bottom surfaces facing the first package substrate 3 of the first and second mass bodies (11, 12) are backed away from the first package substrate 3, as shown in FIG. 1. That is, the thickness of each of the first and second mass bodies (11, 12) in the thickness direction of the sensor unit 1 is determined to be smaller than the thickness of the frame portion 10. Thus, a clearance is ensured between the first package substrate 3 and each of the first and second mass bodies (11, 12). In the present embodiment, a gap length between the first mass body 11 and the first package substrate 3 is set to 10 μm. This value is illustrative only, and therefore the present invention is not limited to it.

On a top surface of the frame portion 10 of the sensor unit 1, a first metal layer 26 is formed over the entire circumference of the frame portion 10. In addition, the sensor unit 1 has a pair of ground portions 19 formed on the frame portion 10 at the vicinity of the fixation portion 17 such that the fixation portion 17 is located between the ground portions. The numeral 27 designates an electrode portion electrically connected to an electrode 25 (FIG. 6) described later, and formed near one of the ground portions 19. The ground portions 19 and the electrode portion 27 are bonded to the first package substrate 3. At the upper-surface side of the sensor unit 1, a second metal layer 28 is formed on the fixation portion 17, the electrode portions 21, one of the ground portions 19 and the electrode portion 27. In this regard, one fixation portion 17, four electrode portions 21, one ground portion 19 and one electrode portion 27 are separately arranged from each other at the upper-surface side of the first package substrate 3. In a state where the second package substrate 2 is not bonded to the frame portion 10, they are electrically insulated from each other. Each of the first and second metal layers (26, 28) is formed by a laminated film of a Ti film and an Au film. In brief, since the first and second metal layers (26, 28) are made of the same metal material, it is possible to simultaneously obtain these metal layers with the same thickness. In each of the first and second metal layers (26, 28), the Ti film preferably has a thickness of 15 to 50 nm, and the Au film preferably has a thickness of 500 nm. These thickness values are illustrative only, and therefore the present invention is not limited to them. As a material for forming the Au film, an Au material containing an impurity may be used in place of pure gold.

The first package substrate 3 bonded to the bottom surface of the sensor unit 1 has heat insulating films (41, 42) such as a silicon oxide film formed on both opposite surfaces in the thickness direction thereof.

The second package substrate 2 bonded to the upper surface of the sensor unit 1 has a concave portion 29 configured to provide a space for positional displacements of the first and second mass bodies (11, 12) at the side facing the sensor unit 1, i.e., in the bottom surface of the second package substrate 2 shown in FIG. 1. In addition, the second package substrate 2 has a plurality of through holes 32 penetrating in the thickness direction. A heat insulating film 33 (a silicon oxide film) is formed on both opposite surfaces in the thickness direction of the second package substrate 2 and inner surfaces of the through holes 32. Therefore, the heat insulating film 33 lies between a through-hole wiring 34 and the inner surface of the through hole 32. In the present embodiment, copper is used as a material for the through-hole wiring 34. Alternatively, nickel may be used in place of copper.

The second package substrate 2 has the above-described electrode 25 (FIGS. 1 and 6) formed at a region facing the first mass body 11 on the bottom surface of the concave portion 29 through the insulating film 33. The electrode 25 is formed by a laminated film of a Ti film and an Au film. In the present embodiment, a gap length between the first mass body 11 and the electrode 25 is set to 10 µm. This value is illustrative only, and therefore the present invention is not limited to it.

In addition, the second package substrate 2 has a (rectangular) frame-like bonding metal layer 36 formed over the entire circumference thereof on the surface facing the sensor unit 1, and a plurality of wiring metal layers 38 electrically connected to the through-hole wirings 34. In this regard, the bonding metal layer 36 is bonded to the first metal layer 26 of the sensor unit 1, and the wiring metal layers 38 are electrically connected to the second metal layers 28 of the sensor unit 1. In the present embodiment, a wiring portion 25a (FIG. 6) extending from the electrode 25 to a peripheral portion of the concave portion 29 is continuously formed with the wiring metal layer 38 bonded to the second metal layer 28 on the electrode portion 27 of the sensor unit 1. Each of the bonding metal layer 36 and the wiring metal layer 38 is formed by a laminated film of a Ti film on the insulating film 33 and an Au film on the Ti film. In brief, since the bonding metal layer 36 and the wiring metal layer 38 are made of the same metal material, it is possible to simultaneously obtain these metal layers with the same thickness. In each of the bonding metal layer 36 and the wiring metal layer 38, the Ti film preferably has a thickness of 15 to 50 nm, and the Au film preferably has a thickness of 500 nm. These thickness values are illustrative only, and therefore the present invention is not limited to them. As a material for forming the Au film, an Au material containing an impurity may be used in place of pure gold. In addition, in the present embodiment, the Ti film is formed as an intermediate layer for improving adhesion. Alternatively, Cr, Nb, Zr, TiN, TaN or the like may be used as the material for the intermediate layer.

The second package substrate 2 has a plurality of electrodes 35 for external connection formed on an opposite surface of the surface facing the sensor unit 1, and electrically connected to the through-hole wirings 34. Each of the electrodes 35 has a rectangular outer peripheral shape. In addition, each of the electrodes 35 is formed by a laminated film of a Ti film and an Au film.

By the way, in the gyro sensor device of the present embodiment, the sensor unit 1 and the first package substrate 3 are coupled to each other by forming a direct bonding between an activated bottom surface of the frame portion 10 of the sensor unit 1 and an activated surface of the insulating film 41 of a silicon oxide film formed on the first package substrate 3 at room temperature. That is, after the bottom surface of the frame portion 10 and the surface of the insulating film 41 are cleaned up and activated by irradiating an atomic beam, an ion beam or a plasma of argon to those surfaces in vacuum, the thus obtained activated surfaces are directly bonded to each other in vacuum by applying an appropriate load at room temperature. As a result, the solid-phase direct bonding without diffusion between Si and $SiO_2$ can be obtained between the bottom surface of the frame portion 10 and the insulating film 41. By performing the bonding step at room temperature, residual stress hardly occurs at the bonding portion. Therefore, it is possible to avoid problems resulting from the residual stress such as variations in sensor characteristics. In addition, a reduction in resistance to electrical noise can be prevented by the bonding through the insulating layer. If necessary, an insulating film such as a silicon oxide film may be formed on the bottom surface of the frame portion 10. In this case, the first package substrate 3 is bonded to the frame portion 10 of the sensor unit 1 by the solid-phase direct bonding between $SiO_2$ and $SiO_2$. Alternatively, in place of forming the insulating film 41 on the upper surface of the first package substrate 3, the insulating film may be formed on the frame portion 10 of the sensor unit 1 to obtain the solid-phase direct bonding between Si and $SiO_2$.

On the other hand, the sensor unit 1 and the second package substrate 2 are coupled to each other by forming a direct bonding between activated surfaces of the first metal layer 26 and the bonding metal layer 36, and a direct bonding between activated surfaces of the second metal layer 28 and the wiring metal layer 38 at room temperature. Thereby, each of the second metal layers 28 of the sensor unit 1 is electrically connected to the electrode 35 for external connection through the wiring metal layer 38 and the through-hole wiring 34. As in the case of bonding between the sensor unit 1 and the first package substrate 3, surfaces of these metal layers are cleaned up and activated by irradiating an atomic beam, an ion beam or a plasma of argon in vacuum. Subsequently, the thus obtained activated surfaces of these metal layers are directly bonded to each other in vacuum by applying an appropriate load at room temperature. As a result, the solid-phase direct bonding between Au and Au can be simultaneously obtained between the first metal layer 26 and the bonding metal layer 36 and between the second metal layer 28 and the wiring metal layer 38. As the material for forming the above-described metal layer, Cu or Al can be used in place of Au.

In the present embodiment, since the sensor unit 1 and the first package substrate 3 are bonded to each other in an airtight sealing manner by the solid-phase direct bonding between Si and $SiO_2$, and the sensor unit 1 and the second package substrate 2 are bonded to each other in an airtight sealing manner by the solid-phase direct bonding between the first metal layer 26 and the bonding metal layer 36, the interior of the sensor device accommodating the gyro sensor unit therein can be maintained in high vacuum atmosphere by performing the bonding step under a reduced atmosphere of a high degree of vacuum. In addition, when an acceleration sensor unit is formed in place of the gyro sensor unit, the interior of the sensor device can be maintained in an inert-gas atmosphere. In the case of adjusting the interior atmosphere of the sensor device, the sensor unit 1, the first package substrate 3 and the second package substrate 2 are placed in a chamber, and the surface activation treatment is performed under a reduced atmosphere. Then, the chamber is adjusted to a desired atmosphere to perform the room-temperature bonding step. When the sensor unit is the acceleration sensor unit, it is preferred that the atmosphere adjusting step is performed by introducing an inert gas such as argon into the chamber at atmospheric pressure. In addition, when the sensor unit is the gyro sensor unit, it is desired that the chamber is maintained in a higher vacuum atmosphere than the degree of vacuum at the time of the surface activation treatment. To prevent the activated surfaces of the sensor unit 1, the first package substrate 3 and the second package substrate 2 from contamination by exposure to the outside air, it is preferred to continuously perform the atmosphere adjusting step and the room-temperature bonding step without taking out them from the chamber after the surface activation treatment.

Figure 7A:
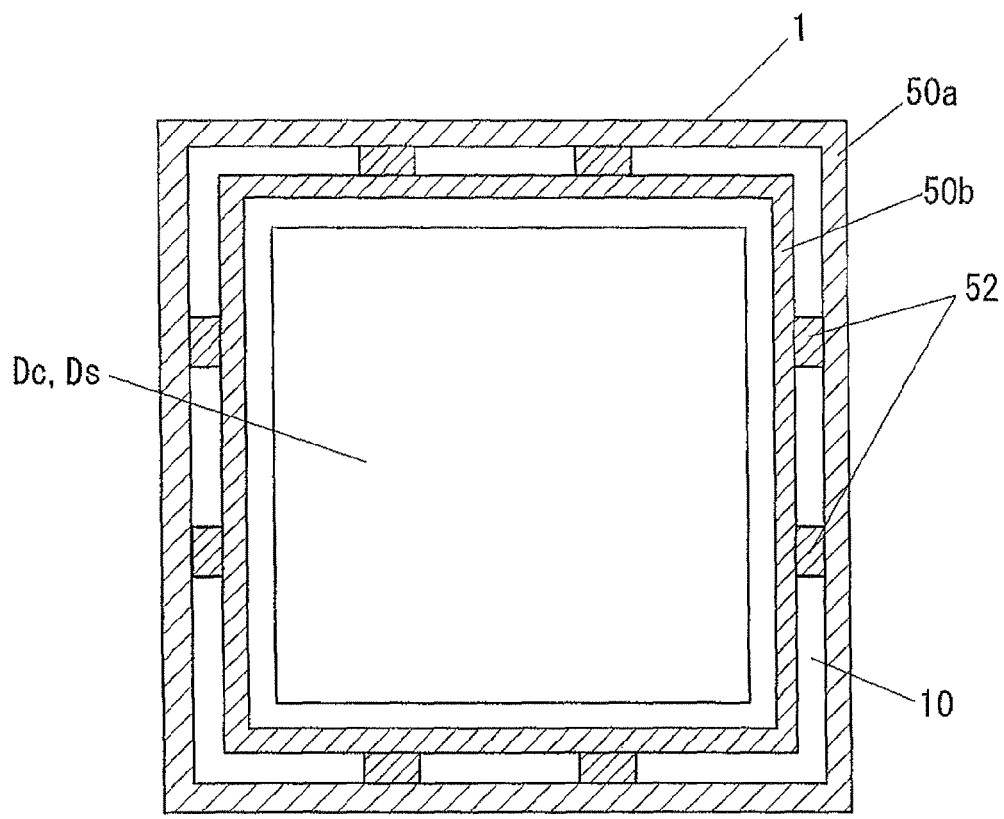
FIG. 7A is a plan view showing insulating films formed on a bottom surface of a frame portion of the sensor unit.
Figure 7B:
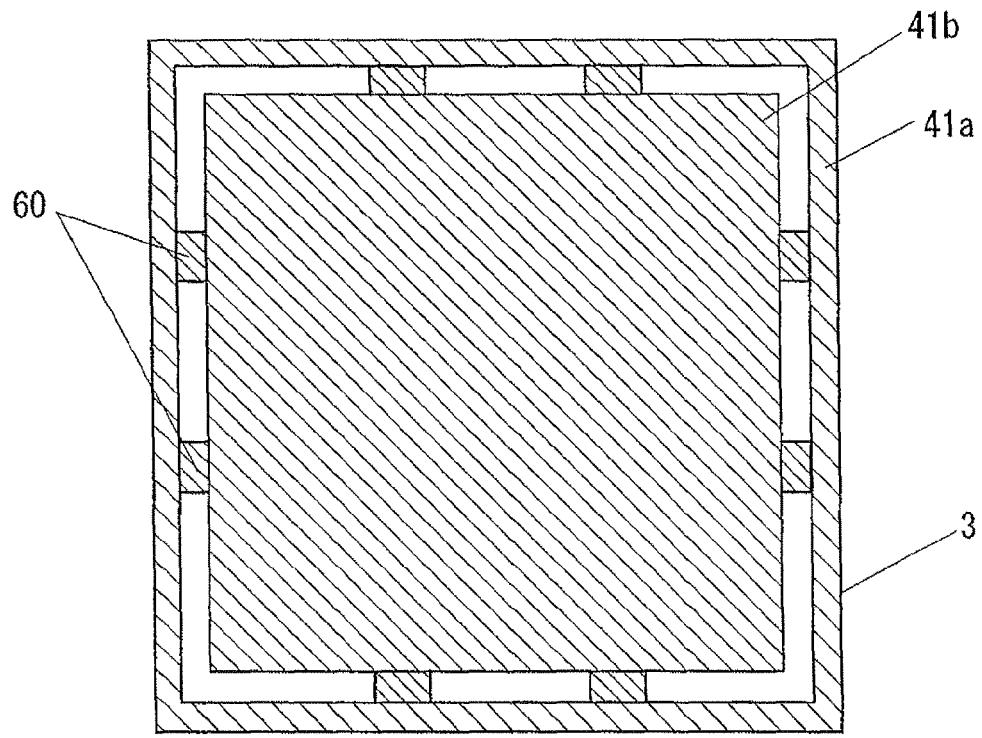
FIG. 7B is a plan view showing insulating films formed on a top surface of a first package substrate.

From the viewpoint of further improving the reliability of airtightness of the inside of the sensor device, it is preferred to form the bonding portion described below between the sensor unit 1 and the first package substrate 3. That is, as shown in FIG. 7A, it is preferred to form an insulating film on the sensor unit 1, which is composed of a ring-like outer insulating film 50a formed on the bottom surface of the frame portion 10 over the entire circumference of the frame portion 10, and a ring-like inner insulating film 50b formed at an inner side of the outer insulating film 50a so as to surround a region for arranging the movable portion Dc (the first mass body 11 and the second mass body 12) and the sensing portion Ds (the stationary comb teeth 23 and the movable comb teeth 24). The outer insulating film 50a is located away from the inner insulating film 50b by a predetermined distance. On the other hand, as shown in FIG. 7B, the first package substrate 3 preferably has an insulating film, which is composed of a ring-like outer insulating film 41a formed at a position facing the outer insulating film 50a and an inner insulating film 41b formed inside of the outer insulating film 41a. Thus, when double bonding regions are formed between the sensor unit 1 and the first package substrate 3, the reliability of airtight sealing of the sensor unit can be further improved.

In FIG. 7A, the numeral 52 designates an auxiliary insulating layer formed such that the outer insulating film 50a is coupled with the inner insulating film 50b. The auxiliary insulating layer 52 is formed at plural positions away from each other in the circumferential direction of the frame portion 10 by a predetermined distance. In addition, as shown in FIG. 7B, auxiliary insulating layers 60 are formed on the first package substrate 3 at positions corresponding to the auxiliary insulating layers 52 of the sensor unit 1. At the time of bonding between the first package substrate 3 and the frame portion 10 of the sensor unit 1, activated surfaces of these auxiliary insulating layers (52, 60) are bonded to each other by means of the solid-phase direct bonding.

The following advantages are expected by the formation of the auxiliary insulating layers (52, 60). That is, when the airtightness of the bonding portion between the outer insulating films (50a, 41a) lowers due to an extraneous substance on the outer insulating film 50a, and the airtightness of the bonding portion between the inner insulating films (50b, 41b) lowers due to another extraneous substance on the inner insulating film 50b, it may become difficult to maintain the airtightness of the sensor device. However, when the auxiliary insulating layers (52, 60) are bonded to each other, a plurality of airtight spaces are defined between the outer insulating film 50a and the inner insulating film 50b. Therefore, when the extraneous substance exists at a position away from another extraneous substance, the region causing a reduction in airtightness of the bonding portion between the outer insulating films (50a, 41a) can be spatially separated from the region causing a reduction in airtightness of the bonding portion between the inner insulating films (50b, 41b) by the bonding between the auxiliary insulating layers (52, 60). In brief, the airtightness obtained by the bonding between the frame portion 10 of the sensor unit 1 and the first package substrate 3 can be further improved in reliability by the bonding between the auxiliary insulating layers (52, 60).

Next, an operation of the gyro sensor of this embodiment is explained.

The gyro sensor of the present embodiment detects a positional displacement of the second mass body 12 when an angular velocity is applied to the gyro sensor by an external force under the condition that a predetermined vibration is given to the first mass body 11. In this regard, a vibrating voltage having a sine waveform or a rectangular waveform is applied between the electrode 25 and the first mass body 11 to vibrate the first mass body 11. For example, an AC voltage is used as the vibrating voltage, but polarity inversion is not essential. The first mass body 11 is electrically connected to the fixation portion 17 through the drive springs 13, the second mass body 12, the detection springs 15 and the coupling member 16. The second metal layer 28 is formed on this fixation portion 17. In addition, the electrode 25 is electrically connected to the second metal layer 28 on the electrode portion 27. Therefore, when the vibrating voltage is applied between the second metal layers 28 on the fixation portion 17 and the electrode portion 27, the first mass body 11 can vibrate in the "z" axis direction due to an electrostatic force between the first mass body 11 and the electrode 25. When the frequency of the vibrating voltage is equal to a resonance frequency determined according to weights of the first and second mass bodies (11, 12), and spring constants of the drive spring 13 and the detection spring 15, a large amplitude can be obtained by a relatively small driving force.

In a state where the first mass body 11 is being vibrated, when an angular velocity is applied to the gyro sensor about the "y" axis, a Coriolis force occurs in the "x" axis direction, so that the second mass body 12 (with the first mass body 11) is displaced in the "x" axis direction relative to the stationary part 20. When the movable comb teeth 24 are displaced relative to the stationary comb teeth 23, a change in distance between the movable comb teeth 24 and the stationary comb teeth 23 occurs, so that the electric capacitance therebetween changes. This change in electric capacitance can be taken out from the second metal layers 28 connected to the four stationary parts 20. Thus, it can be regarded that the above-described gyro sensor is provided with four variable capacitance capacitors. Therefore, the positional displacement of the second mass body 12 can be detected by measuring the electric capacitance of each of the variable capacitance capacitors, or the total capacitance of the variable capacitance capacitors connected in parallel. Since the vibration of the first mass body 11 is previously determined, the Coriolis force can be calculated by detecting the positional displacement of the second mass body 12. In the present embodiment, the movable portion disposed inside of the frame portion 10 is composed of the first mass body 11, the drive springs 13, the second mass body 12, the detection springs 15 and the coupling member 16, and the sensing portion is composed of the stationary comb teeth 23 and the movable comb teeth 24 formed on the second mass body 12. In brief, a part of the sensing portion is formed in the movable portion disposed inside of the frame portion 10.

In this regard, the positional displacement of the movable comb member 24 is proportional to (the weight of the first mass body 11)/(the weight of the first mass body 11+the weight of the second mass body 12). Therefore, as the weight of the first mass body 11 becomes larger than the weight of the second mass body 12, the positional displacement of the movable comb teeth 24 increases. As a result, an improvement in sensitivity is achieved. In the present embodiment, from this reason, the thickness dimension of the first mass body 11 is determined to be larger than the thickness dimension of the second mass body 12.

In the above-explained gyro sensor device of the present embodiment, since each of the sensor unit 1, the first package substrate 3, and the second package substrate 2 is formed by use of the semiconductor substrate, it is possible to reduce the influence of thermal stress resulting from a linear expansion coefficient therebetween, and minimize variations in sensor characteristics. In addition, a reduction in resistance to electrical noise can be prevented because the sensor unit 1 is bonded to the first package substrate 3 through the insulating film 41.

From the viewpoints of achieving reductions in size and production cost of the sensor device, it is preferred that the above-described gyro sensor device is manufactured by using the wafer level package technique. For example, after a sensor wafer having formation sites for a plurality of the sensor units 1, in each of which a part of component parts for the sensor unit is formed, is bonded to a package wafer having a plurality of the first package substrates 3, an etching step of separating the movable portion from the other portion with respect to each of the sensor units 1 is performed. Subsequently, a package wafer having a plurality of the second package substrates 2 is bonded to the sensor wafer to obtain the wafer level package structure, in which a plurality of the sensor units 1 are integrally formed. By cutting (dicing) this wafer level package structure into a size of the sensor unit, it is possible to individually separate the gyro sensor devices therefrom. Thus, the wafer level package technique is particularly suitable to manufacture compact gyro sensor devices.

Second Embodiment

Figure 8:
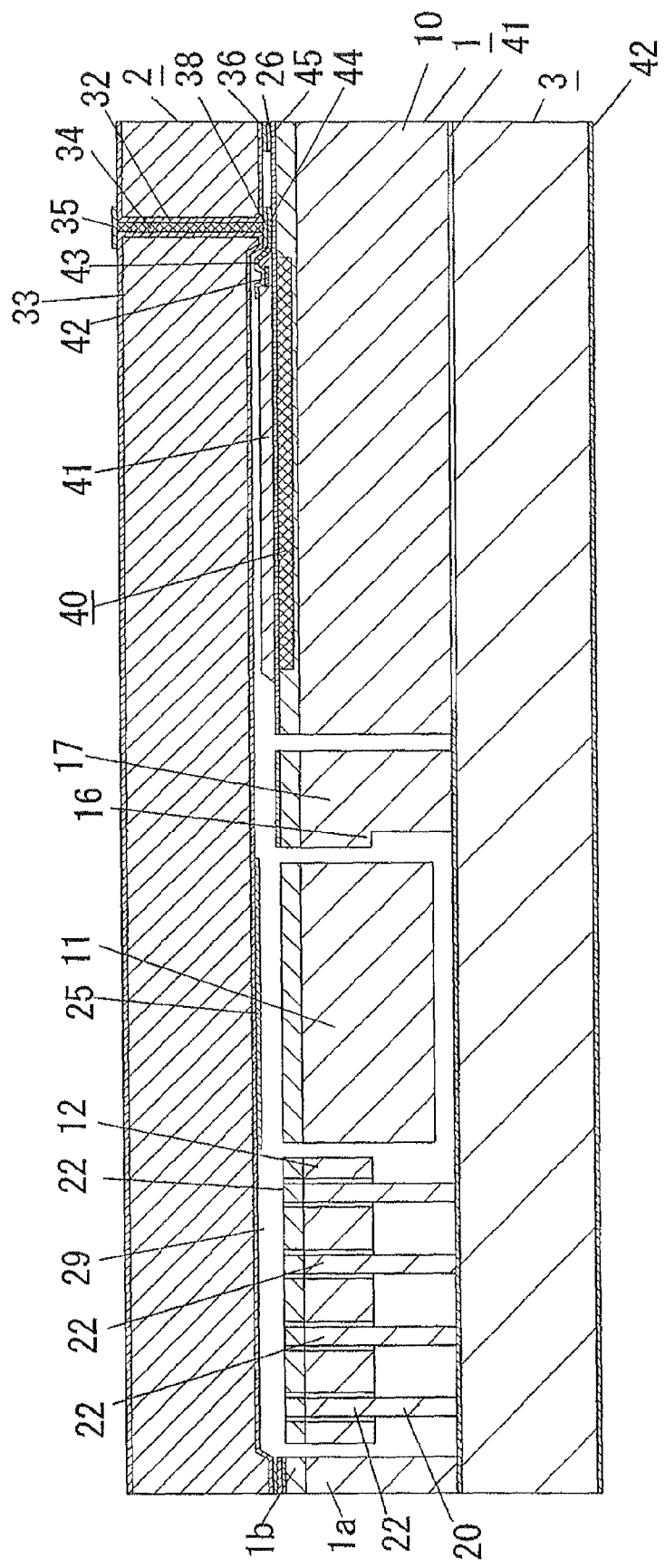
FIG. 8 is a schematic cross-sectional view of a gyro sensor device according to a second embodiment of the present invention.
Figure 9:
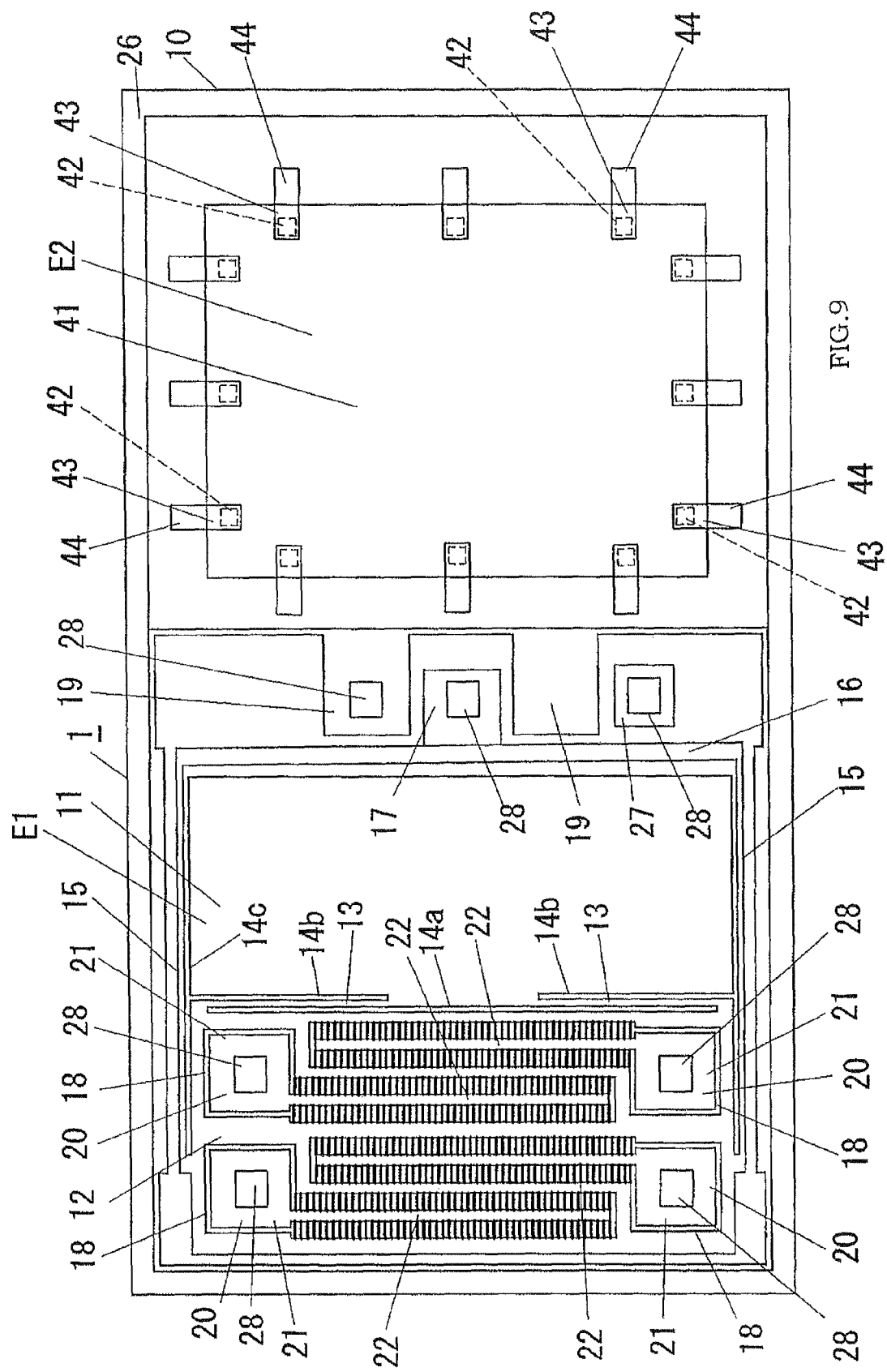
FIG. 9 is a schematic plan view of a sensor unit of the gyro sensor device.

Referring to FIGS. 8 and 9, the sensor device of the present embodiment is explained below in detail.

The basic configuration of the gyro sensor of the present embodiment is substantially the same as that of the first embodiment except for the following features. That is, as the semiconductor material for forming the sensor unit 1, a so-called epitaxial substrate is used, which is obtained by epitaxial growth of a single crystal silicon layer $1b$ on the silicon substrate $1a$. The silicon layer $1b$ has a higher resistivity than the silicon substrate $1a$. In addition, an integrated circuit 40 such as an integrated circuit (CMOS IC) using CMOS is mounted to be operable in collaboration with a sensing portion. In the present embodiment, the resistivity of the silicon substrate $1a$ is 0.2 Ω·cm, and the resistivity of the silicon layer $1b$ is 20 Ω·cm. These resistivity values are illustrative only, and the present invention is not limited to them. The integrated circuit 40 of the present embodiment comprises a signal processing circuit configured to execute signal processing such as amplification, offset adjustment and temperature compensation to an output signal of the sensing portion explained in the first embodiment, and an EEPROM for storing data used in the signal processing circuit. The same components as the first embodiment are denoted by the same reference numerals, and therefore duplicate explanations will be omitted.

The sensor unit 1 of the present embodiment has a larger outside dimension in an array direction of the first mass body 11 and the second mass body 12, as compared with the outside dimension of the sensor unit of the first embodiment. That is, a sensor region E1 having the first mass body 11 and the second mass body 12 and an IC region E2 having the integrated circuit 40 are arranged in parallel in a lateral direction along the top surface of the sensor unit 1. The frame portion 10 extends so as to surround the sensor region E1 and the IC region E2.

The integrated circuit 40 is formed in the silicon layer $1b$ of the frame portion 10. In the IC region E2, a multilayer wiring technique is used to achieve a reduction in occupied area of the IC region E2 in the sensor unit 1. Due to this reason, the IC region E2 of the sensor unit 1 has a multilayer structure portion 41 formed on the silicon layer $10b$ through the insulating film 45. The multilayer structure portion 41 comprises an interlayer insulating film, a passivation film and so on. By removing appropriate portions of the passivation film, a plurality of pads 42 are exposed. Each of the pads 42 is electrically connected to a third metal layer 44 through an outgoing wiring 43 made of a metal material such as Au. The third metal layer 44 is formed on the silicon layer $1b$ through the insulating layer 45. The third metal layer 44 is also electrically connected to a wiring metal layer 38 of the second package substrate 2. In addition, the second package substrate 2 has a metal wiring layer (not shown) for making an electrical connection between the wiring metal layer 38 and a second metal layer 28 formed on the sensor region E1. In addition, a first metal layer 26 is formed on the insulating film 45.

From the viewpoint of improving the sensitivity of the gyro sensor device, it is desired to perform impurity doping such that the resistivity of a region corresponding to the sensor region E1 of the silicon layer $1b$ is substantially equal to the resistivity of the silicon substrate $1a$. In the present embodiment, the second package substrate 2 has a concave portion 29 with a larger aperture area, as compared with the first embodiment, which is formed over a range corresponding to the sensor region E1 and the IC region E2.

In the gyro sensor device of the present invention, as in the case of the first embodiment, since each of the sensor unit 1, the first package substrate 3 and the second package substrate 2 is formed by use of the semiconductor substrate, it is possible to reduce the influence of thermal stress resulting from a linear expansion coefficient therebetween, and minimize variations in sensor characteristics. In addition, a reduction in resistance to electrical noise can be prevented because the sensor unit 1 is bonded to the first package substrate 3 through the insulating film 41. Furthermore, according to the present embodiment, further reductions in cost and thickness of the gyro sensor device can be achieved, as compared with the case of individually accommodating, in a single package, an IC chip with the integrated circuit operable in collaboration with the sensing portion. In addition, the sensor characteristics can be further improved due to a decrease in wiring length between the sensing portion and the integrated circuit.

In the above embodiments, the gyro sensor was exemplified as the sensor device. However, the technical concept of the present invention is also available for the other sensor device such as an capacitance-type acceleration sensor and a piezoresistance-type acceleration sensor. In the piezoresistance-type acceleration sensor, a movable portion is formed with a frame portion, a weight portion disposed inside of the frame portion, and thin flexible portions each extending between the frame portion and the weight portion, and a sensing portion is composed of piezoresistive elements formed on the flexible portions.

INDUSTRIAL APPLICABILITY

As understood from the above embodiments, the bonding between the electrical insulating film on one of the sensor unit and the package substrate and the other one of the sensor unit and the package substrate, or the bonding between the electrical insulating films on the sensor unit and the package substrate is formed by the solid-phase direct bonding without diffusion between their activated surfaces. Therefore, it is possible to avoid the occurrence of inconveniences such as variations in sensor characteristics resulting from residual stress at the bonding interface. In addition, the bonding through the electrical insulating film can prevent a reduction in resistance to electrical noise. Furthermore, the interior of the sensor device can be airtightly maintained in an appropriate atmosphere depending on the kind of sensor by the solid-phase direct bonding. The present invention having these advantages is particularly suitable for producing a compact sensor device according to a wafer level packaging technique.

The invention claimed is:

1. A sensor device comprising:
a sensor unit comprising a frame made of a semiconductor material and having an opening, a movable portion held in said opening to be movable relative to said frame, and a detecting portion configured to output an electric signal according to a positional displacement of said movable portion; and
a package substrate made of a semiconductor material, and bonded to a surface of said sensor unit;
wherein a region of said frame bonded to said package substrate has one of an activated surface of said frame and an activated surface of an electrical insulating film formed on said frame;
a region of said package substrate bonded to said frame has one of an activated surface of said package substrate and an activated surface of an electrical insulating film formed on said package substrate; and
the bonding between said sensor unit and said package substrate is a solid-phase direct bonding without diffusion between the activated surfaces in the presence of at least one of the electrical insulating films
wherein at least one of the electrically insulating film formed on said frame and the electrically insulating film formed on said package substrate is composed of a ring-like outer insulating film formed so as to surround said movable portion, and a ring-like inner insulating film formed so as to surround said movable portion at an inner side of said outer insulating film,
wherein each of the electrically insulating film formed on said frame and the electrically insulating film formed on said package substrate is composed of said outer insulating film, said inner insulating film, and an auxiliary insulating film configured to connect between said outer insulating film and said inner insulating film, which is formed at plural locations spaced from each other by a predetermined distance in a circumferential direction of said inner insulating film, and
wherein each of a bonding between said outer insulating films, a bonding between said inner insulating films, and a bonding between said auxiliary insulating films is provided by the solid-phase direct bonding.

2. The sensor device as set forth in claim 1, wherein the activated surface is any one of a plasma-treated surface, an ion-beam irradiated surface, and an atomic-beam irradiated surface.

3. The sensor device as set forth in claim 1, wherein the bonding between said sensor unit and said package substrate is the solid-phase direct bonding between the activated surface of the electrical insulating film formed on said frame and the activated surface of the electrical insulating film formed on said package substrate,
wherein the electrical insulating film formed on said frame is silicon oxide, and the electrical insulating film formed on said package substrate is silicon oxide.

4. The sensor device as set forth in claim 1, wherein the bonding between said sensor unit and said package substrate is the solid-phase direct bonding between the activated surface formed on said frame and the activated surface of the electrical insulating film formed on said package substrate, and
wherein the activated surface formed on said frame is silicon, and the electrical insulating film formed on said package substrate is silicon oxide.

5. The sensor device as set forth in claim 1, wherein the bonding between said sensor unit and said package substrate is the solid-phase direct bonding between the activated surface of the electrical insulating film formed on said frame and the activated surface formed on said package substrate, and
wherein the electrical insulating film formed on said frame is silicon oxide, and the activated surface formed on said package substrate is silicon.

6. The sensor device as set forth in claim 1, wherein an integrated circuit operable in collaboration with said detecting portion is mounted on said frame of said sensor unit.

7. The sensor device as set forth in claim 1, wherein said sensor unit is a gyro sensor unit,
said movable portion comprises a first mass body vibrated by a vibrating means, and a second mass body coupled to the first mass body, and
said detecting portion is configured to convert a positional displacement of the second mass body caused when a rotational force is applied during a vibration of the first mass body into an electrical signal.

8. The sensor device as set forth in claim 1, wherein an interior of said sensor unit is sealed airtight under a reduced atmosphere by the solid-phase direct bonding.

9. The sensor device as set forth in claim 1, wherein said sensor unit is bonded at one of opposite surfaces to said package substrate, and at the other surface to a second package substrate,
the bonding between said sensor unit and said second package substrate is a solid-phase direct bonding without diffusion between a surface-activated region formed on said sensor unit and a surface-activated region formed on said second package substrate.

10. The sensor device as set forth in claim 9, wherein said frame comprises a ring-like first metal layer formed so as to surround said movable portion, and a second metal layer formed at a side closer to said movable portion than said first metal layer, and electrically connected with said detecting portion,
said second package substrate comprises a through-hole wiring, a ring-like bonding metal layer formed at a position facing said first metal layer, and a wiring metal layer formed at a position facing said second metal layer, and connected with said through-hole wiring, and
the bonding between said sensor unit and said second package substrate is provided by a solid-phase direct bonding without diffusion between activated surfaces of said first metal layer and said bonding metal layer and a solid-phase direct bonding without diffusion between activated surfaces of said second metal layer and said wiring metal layer.

* * * * *